United States Patent
Ryu et al.

(10) Patent No.: US 8,338,215 B2
(45) Date of Patent: Dec. 25, 2012

(54) SOLAR CELL MODULE AND METHOD FOR MANUFACTURING THE SAME

(75) Inventors: Jin-Mun Ryu, Hwasung-si (KR);
Ho-Seop Jeong, Sungnam-si (KR);
Tae-Young Kim, Seoul (KR);
Byung-Jae Kim, Suwon-si (KR);
In-Taek Song, Sungnam-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 344 days.

(21) Appl. No.: 12/777,744

(22) Filed: May 11, 2010

(65) Prior Publication Data

US 2011/0146780 A1    Jun. 23, 2011

(30) Foreign Application Priority Data

Dec. 21, 2009   (KR) .................. 10-2009-0128298

(51) Int. Cl.
*G01R 31/26* (2006.01)
*H01L 21/00* (2006.01)

(52) U.S. Cl. ............ 438/64; 438/15; 438/127; 257/433; 257/E25.009; 257/E27.124

(58) Field of Classification Search .............. 438/15, 438/64, 127; 257/433, E25.009, E27.124
See application file for complete search history.

(56) References Cited

U.S. PATENT DOCUMENTS

| | | | |
|---|---|---|---|
| 4,724,010 A * | 2/1988 | Okaniwa et al. | 136/246 |
| 5,800,631 A * | 9/1998 | Yamada et al. | 136/251 |
| 6,175,075 B1 * | 1/2001 | Shiotsuka et al. | 136/251 |
| 2010/0175753 A1 * | 7/2010 | Maeda et al. | 136/256 |
| 2011/0155203 A1 * | 6/2011 | Funakoshi | 136/244 |
| 2011/0223703 A1 * | 9/2011 | Doi et al. | 438/64 |
| 2011/0223704 A1 * | 9/2011 | Doi et al. | 438/64 |

FOREIGN PATENT DOCUMENTS

KR  10-2009-0011713   2/2009

OTHER PUBLICATIONS

Korean Office Action, w/ partial English translation thereof, Issued in Korean Patent Application No. KR 10-2009-0128298 dated Mar. 14, 2011.

* cited by examiner

*Primary Examiner* — Jarrett Stark
*Assistant Examiner* — Nicholas Tobergte
(74) *Attorney, Agent, or Firm* — McDermott Will & Emery LLP

(57) ABSTRACT

A solar cell module and a method of manufacturing the solar cell module are disclosed. The method in accordance with an embodiment of the present invention includes forming a conductive bump on a conductive pad formed on one surface of a solar cell, forming a circuit pattern on one surface of a transparent substrate, in which the circuit pattern corresponds to a position of the conductive bump, adhering the solar cell to the transparent substrate in such a way that the conductive bump is in direct contact with the circuit pattern, and forming a protective resin layer on one surface of the transparent substrate in such a way that the solar cell is covered. By using the above steps, a thinner solar cell module can be implemented while improving the manufacturing efficiency.

15 Claims, 9 Drawing Sheets

SOLAR CELL MODULE AND METHOD FOR MANUFACTURING THE SAME

CROSS-REFERENCE TO RELATED APPLICATIONS

This application claims the benefit of Korean Patent Application No. 10-2009-0128298, filed with the Korean Intellectual Property Office on Dec. 21, 2009, the disclosure of which is incorporated herein by reference in its entirety.

BACKGROUND

1. Technical Field

The present invention is related to a solar cell module and a method of manufacturing the same.

2. Description of the Related Art

A solar cell is an electronic component that can convert the sunlight to electricity by using a P-type semiconductor and an N-type semiconductor. The solar cell is manufactured as a solar cell module and used as a secondary power source for mobile electronic devices.

A solar cell module can include a light-permeating glass substrate, a solar cell and a circuit board, which provides electrical connection to the solar cell. The solar cell module is manufactured by mounting the solar cell on the circuit board, wire-bonding the solar cell to the circuit board, and then molding a transparent resin over the solar cell.

With the recent trends toward smaller mobile electronic devices, however, it may be difficult to manufacture a thinner solar cell module and save the manufacturing cost by using the above manufacturing method.

SUMMARY

The present invention provides a thinner solar cell module and a method of manufacturing the solar cell module that simplifies the manufacturing process.

An aspect of the present invention provides a method of manufacturing a solar cell module. The method in accordance with an embodiment of the present invention can include forming a conductive bump on a conductive pad formed on one surface of a solar cell, forming a circuit pattern on one surface of a transparent substrate, in which the circuit pattern corresponds to a position of the conductive bump, adhering the solar cell to the transparent substrate in such a way that the conductive bump is in direct contact with the circuit pattern, and forming a protective resin layer on the one surface of the transparent substrate in such a way that the solar cell is covered.

In the adhering of the solar cell to the transparent substrate, the solar cell and the transparent substrate can be separated from each other such that an air layer is formed between the solar cell and the transparent substrate.

The method can further include, between the forming of the circuit pattern and the adhering of the solar cell to the transparent substrate, forming a junction layer on the one surface of the transparent substrate.

The junction layer can be formed on a position corresponding to positions of both sides of the bump. The bump can be provided as a plurality of bumps, and the plurality of bumps can be formed on the one surface of the solar cell and separated from one another.

The junction layer can be formed and extended on both sides of the bump so as to prevent the protective resin layer from entering through the plurality of bumps.

The junction layer can include thermosetting resin, and the adhering of the solar cell to the transparent substrate can include heating the junction layer and pressing the solar cell toward the transparent substrate.

The method can further include, before the forming of the circuit pattern, forming an antireflection layer on the one surface of the transparent substrate. The other surface of the transparent substrate can be formed in a convexly curved shape such that light is converged toward the solar cell.

Another aspect of the present invention provides a method of manufacturing a solar cell module. The method in accordance with an embodiment of the present invention can include forming a circuit pattern on one surface of a transparent substrate, forming a conductive bump on the circuit pattern, adhering the transparent substrate to a solar cell in such a way that the conductive bump is in direct contact with a conductive pad formed on one surface of the solar cell and forming a protective resin layer on the one surface of the transparent substrate in such a way that the solar cell is covered.

In the adhering of the transparent substrate to the solar cell, the solar cell and the transparent substrate can be separated from each other such that an air layer is formed between the solar cell and the transparent substrate.

The method can further include, before the adhering of the transparent substrate to the solar cell, forming a junction layer on the one surface of the solar cell.

The junction layer can include thermosetting resin, and the adhering of the transparent substrate to the solar cell can include heating the junction layer and pressing the solar cell toward the transparent substrate.

The method can further include, before the forming of the circuit pattern, forming an antireflection layer on the one surface of the transparent substrate.

The other surface of the transparent substrate can be formed in a convexly curved shape such that light is converged toward the solar cell.

Still another aspect of the present invention provides a solar cell module. The solar cell module in accordance with an embodiment of the present invention can include a transparent substrate, through which light permeates, a circuit pattern, which is formed on one surface of the transparent substrate, a solar cell, which generates electricity by receiving the light, a conductive pad, which is formed on one surface of the solar cell, a conductive bump, which is interposed between the circuit pattern and the conductive pad, and a protective resin layer, which covers the other surface of the solar cell.

The solar cell and the transparent substrate can be separated from each other such that an air layer is formed between the solar cell and the transparent substrate.

The solar cell module can further include a junction layer, which is interposed between the solar cell and the transparent substrate. The junction layer can be formed on a position corresponding to positions of both sides of the bump.

The bump can be provided as a plurality of bumps, and the plurality of bumps can be separated from one another. The junction layer can be formed and extended on both sides of the bump so as to prevent the protective resin layer from entering through the plurality of bumps.

The solar cell module can further include an antireflection layer, which is formed on the one surface of the transparent substrate.

The other surface of the transparent substrate can be formed in a convexly curved shape such that the light is converged toward the solar cell.

Additional aspects and advantages of the present invention will be set forth in part in the description which follows, and in part will be obvious from the description, or may be learned by practice of the invention.

DETAILED DESCRIPTION

Figure 1:
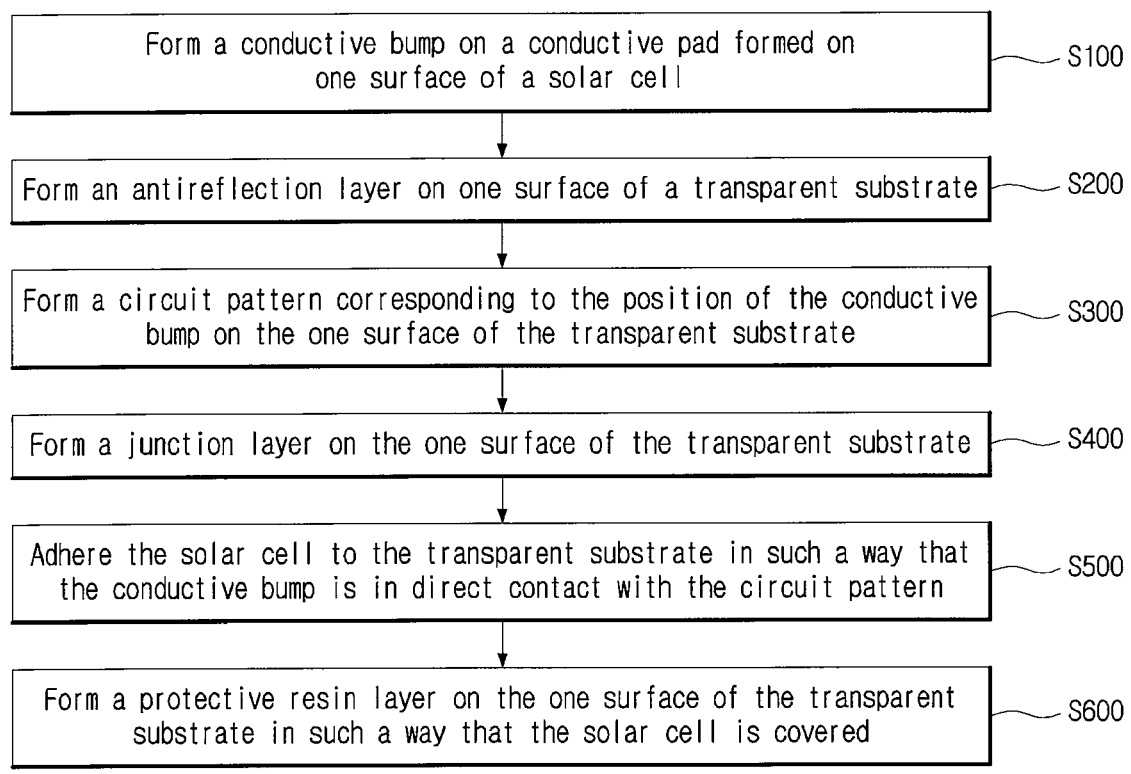
FIG. 1 is a flow diagram illustrating a method of manufacturing a solar cell module in accordance with an embodiment of the present invention.

The features and advantages of this invention will become apparent through the below drawings and description.

A solar cell module and a method of manufacturing the solar cell module according to a certain embodiment of the present invention will be described below in more detail with reference to the accompanying drawings. Those components that are the same or are in correspondence are rendered the same reference numeral regardless of the figure number, and redundant descriptions are omitted.

FIG. 1 is a flow diagram illustrating a method of manufacturing a solar cell module 1000 in accordance with an embodiment of the present invention, and FIGS. 2 to 8 are cross-sectional views illustrating a method of manufacturing the solar cell module 1000 in accordance with an embodiment of the present invention.

As illustrated in FIGS. 1 to 9, the method of manufacturing the solar cell module 1000 in accordance with an embodiment of the present invention can include forming a conductive bump 220 on a conductive pad 210 formed on one surface of a solar cell 200 (S100), forming an antireflection layer 110 on one surface of a transparent substrate 100 (S200), forming a circuit pattern 120 corresponding to the position of the conductive bump 220 on the one surface of the transparent substrate 100 (S300), forming a junction layer 130 on the one surface of the transparent substrate 100 (S400), adhering the solar cell 200 to the transparent substrate 100 in such a way that the conductive bump 220 is in direct contact with the circuit pattern 120 (S500) and forming a protective resin layer 400 on the one surface of the transparent substrate 100 in such a way that the solar cell 200 is covered (S600). By using the above steps, a thinner solar cell module 1000 can be implemented while improving the manufacturing efficiency.

Figure 2:
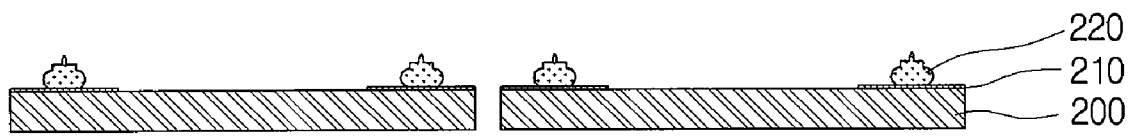
FIGS. 2 to 8 are cross-sectional views illustrating a method of manufacturing a solar cell module in accordance with an embodiment of the present invention.

First, as illustrated in FIG. 2, the conductive bump 220 can be formed on the conductive pad 210 formed on one surface of the solar cell 200 (S100). The solar cell 200 can refer to an electronic component that can receive the sunlight and convert the sunlight to electrical energy.

The solar cell 200 can have the conductive pad 210 formed on one surface thereof in order to transfer the electricity, which is generated by receiving the sunlight, to the outside. The solar cell 200 can be formed in the shape of, for example, a rectangular cuboid, and the conductive pad 210 can be formed on both sides of one surface of the solar cell 200.

The conductive bump 220 can be formed on the conductive pad 210 and provide electrical connection to the solar cell 200. The conductive bump 220 can be made of a conductive paste, which can be ejected to the conductive pad 210 to form the conductive bump 220.

The conductive bump 220 can be cured through a heating process. In this step, it is possible that the conductive bump 220 has been discharged on the conductive pad 210 before the bump 220 is cured. The bump 220 can be provided as a plurality of bumps 220 that are separated from one another.

Figure 3:
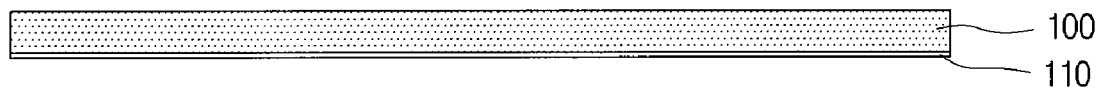

Next, as illustrated in FIG. 3, the antireflection layer 110 can be formed on one surface of the transparent substrate 100 (S200). The transparent substrate 100 can be made of a light-permeating material, for example, glass or light-permeable resin.

The antireflection layer 110 can be formed by antireflection coating one surface of the transparent substrate 100. The permeability of the transparent substrate 100 having the antireflection layer 110 formed thereon can be improved, thus improving the efficiency of the solar cell module 1000.

Figure 4:
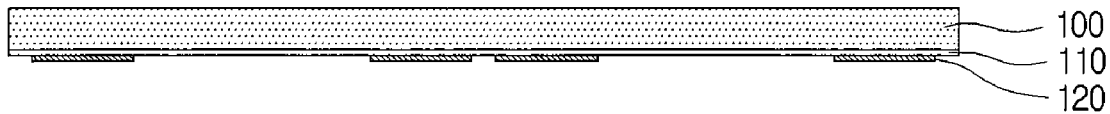

Next, as illustrated in FIG. 4, the circuit pattern 120 can be formed on the one surface of the transparent substrate 100 in such a way that the circuit pattern 120 can correspond to the position of the bump 220 (S300). Since the circuit pattern 120 is in direct contact with the bump 220 in a step to be described later, the solar cell 200 can be electrically connected to the outside.

A plurality of solar cells 200 can be coupled to a single transparent substrate 100, and the circuit pattern 120 can be formed to correspond to the position of each bump 220 of the solar cells 200. For the circuit pattern 120, a layer made of a conductive metal with a certain pattern can be formed on the transparent substrate 100.

It shall be evident that the forming of the conductive bump 220 (S100), the forming of the antireflection layer 110 (S200) and the forming of the circuit pattern 120 (S300) can be performed individually and that the above steps can be performed regardless of the order.

Figure 5:
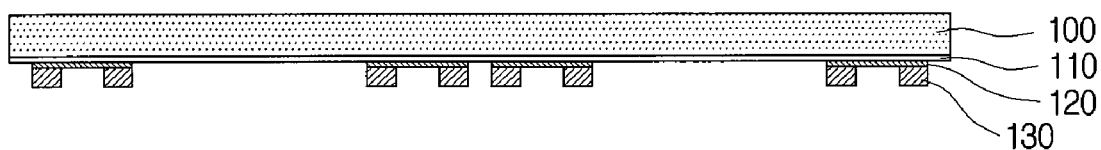

Next, as illustrated in FIG. 5, the junction layer 130 can be formed on the one surface of the transparent substrate 100 (S400). In the following process (S500), which will be described later, the upper end and lower end of the junction layer 130 can be adhered to one surface of the solar cell 200 and one surface of the transparent substrate 100, respectively, thus providing an adhesive strength between them.

Through the adhering process (S500), the junction layer 130 is formed in the shape of walls that stand on both sides of the bump 220. For this, the junction layer 130 can be formed on the transparent substrate 100 corresponding to the positions of the both sides of the bump 220. The plurality of solar cells 200 can be adhered to a single transparent substrate 100, and the junction layer 130 can be formed to correspond to the position of each bump 220.

The plurality of bumps 220 can be formed in a row, and the junction layer 130 can be extended in a direction in which the plurality of bumps 220 are formed, like the walls formed on both sides of the bump 220. Therefore, the bumps 220 can be housed in a groove that is formed between two junction layers 130.

The junction layer 130 can be sufficiently thick enough to separate the transparent substrate 100 from the solar cell 200 so that an air layer can be formed between the transparent substrate 100 and the solar cell 200 to improve the permeability.

The junction layer 130 can be made of thermosetting resin. In the adhering process (S500), which will be described later, the junction layer 130 can have an adhesive strength by heating and cured by cooling.

Figure 6:
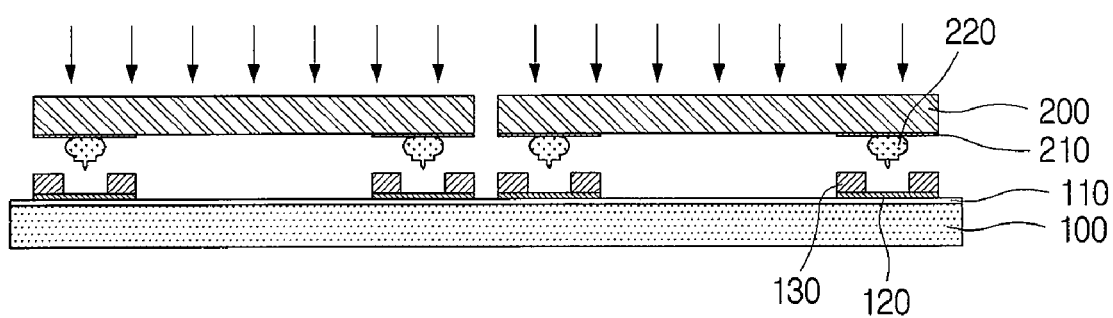

Next, as illustrated in FIG. 6, the solar cell 200 can be adhered to the transparent substrate 100 in such a way that the bump 220 is in direct contact with the circuit pattern 120 (S500).

For adhesion, the solar cell 200 can be disposed in accordance with the position of the junction layer 130. Then, the solar cell 200 can be pressed toward the transparent substrate 100 while heating the other surface of the solar cell 200 to heat the bump 220 and the junction layer 130.

An adhesive strength can be provided between the solar cell 200 and the transparent substrate 100 by the heated and pressed bump 220 and junction layer 130.

By adjusting the force of pressing, an air layer having a proper thickness can be formed between the solar cell 200 and the transparent substrate 100.

Figure 7:
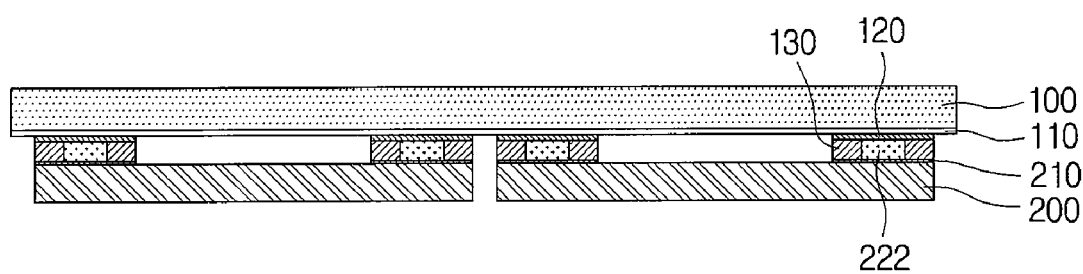

As illustrated in FIG. 7, an adhered structure can be formed between the solar cell 200 and the transparent substrate 100 by cooling the bump 222 and the junction layer 130.

Figure 8:
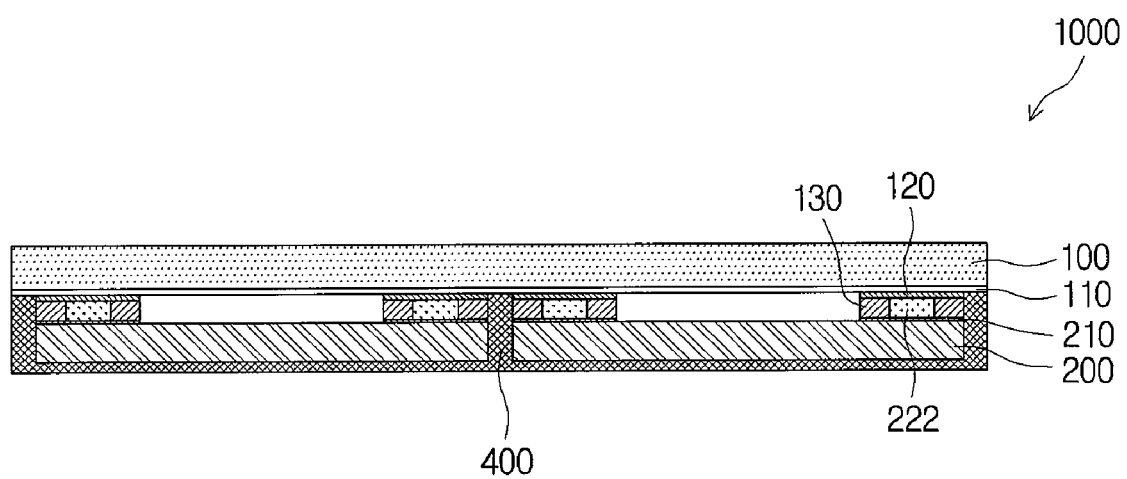

Next, as illustrated in FIG. 8, the protective resin layer 400 can be formed on the one surface of the transparent substrate 100 in such a way that the solar cell 200 is covered (S600). The protective resin layer 400 can be made of a material including thermosetting resin. The protective resin layer 400 can be coated and cured on the solar cell 200, which is adhered to one surface of the transparent substrate 100, so as to cover the solar cell 200.

Since, as described above, the junction layer 130 is extended lengthwise along both sides of the bump 222, protective resin can be prevented from being interposed between one surface of the solar cell 200 and one surface of the transparent substrate 100 during the coating and curing processes of the protective resin layer 400.

Since the method of manufacturing the solar cell module 1000 in accordance with the present embodiment uses a coupling structure of the bump 222 and the junction layer 130, a complex process for forming electrical connection with the solar cell 200 can be omitted, thus simplifying the manufacturing process. Moreover, since the electrical connection structure, which has been an obstacle in making the solar cell module 1000 thinner, of the solar cell 200 is simplified, a thinner solar cell module 1000 can be implemented.

Figure 9:
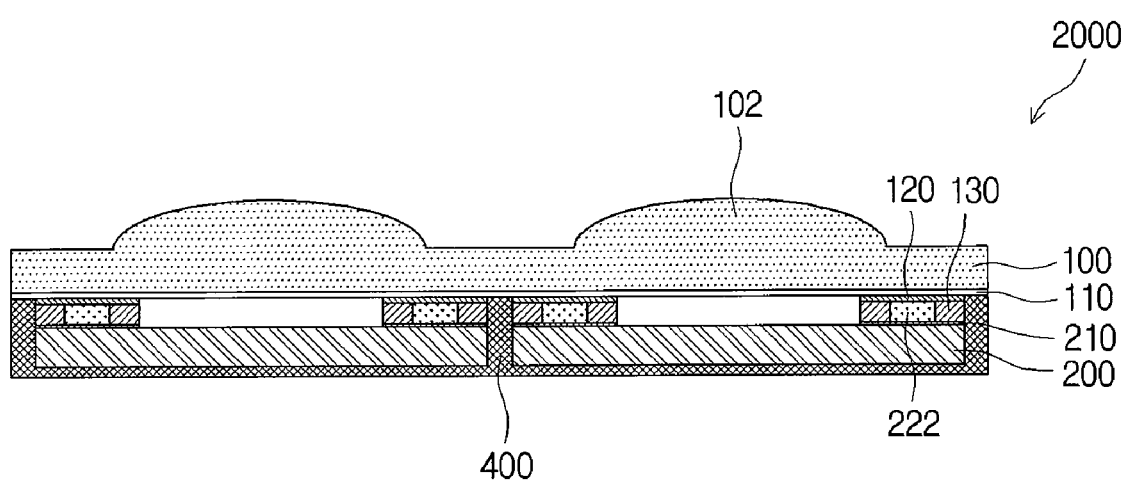
FIG. 9 is a cross-sectional view illustrating a modification of a solar cell module in accordance with an embodiment of the present invention.

FIG. 9 is a cross-sectional view illustrating a modification of the solar cell module 1000 in accordance with an embodiment of the present invention. As illustrated in FIG. 9, the other surface of the transparent substrate 100 can be formed in a convexly curved shape such that the sunlight can be converged toward the solar cell 200.

In effect, the structure of the transparent substrate 100 shown in FIG. 9 can employ a smaller solar cell 200 by reducing the sunlight-permeating range, and thus can provide a much thinner solar cell module 1000.

A convexly curved portion 102 of the transparent substrate 100 can function as a convex lens. Here, the convexly curved portion 102 can be formed to correspond to the position of each solar cell 200.

It shall be evident that the transparent substrate 100 shown in FIG. 9 can be convexly formed by processing the other surface or by injecting transparent resin into a mold that is shaped like the one shown in FIG. 9.

Although the present embodiment describes an example of forming the junction layer 130 on one surface of the transparent substrate 100 and the bump 222 on one surface of the solar cell 200, it shall be evident that the reverse is also possible. That is, the circuit pattern 120 can be formed on one surface of the transparent substrate 100; the conductive bump 220 can be formed on the circuit pattern 120 to correspond to the position of the bump 220 of the solar cell 200; the junction layer 130 can be formed on both sides of the conductive pad 210, which is formed on one surface of the solar cell 200; and the conductive bump 220 and the junction layer 130 can be heated and pressed so that the conductive bump 220 makes direct contact with the conductive pad 210. Then, after the solar cell 200 and the transparent substrate 100 is adhered to each other, the protective resin layer 400 can be formed on one surface of the transparent substrate 100 so as to cover the solar cell 200.

In this case also, the antireflection layer 110 can also be formed on one surface of the transparent substrate 100 before the circuit pattern 120 is formed.

While the spirit of the present invention has been described in detail with reference to a particular embodiment, the embodiment is for illustrative purposes only and shall not limit the present invention. It is to be appreciated that those skilled in the art can change or modify the embodiment without departing from the scope and spirit of the present invention.

What is claimed is:

1. A method of manufacturing a solar cell module, the method comprising:
    forming a conductive bump on a conductive pad formed on one surface of a solar cell;
    forming a circuit pattern on one surface of a transparent substrate, the circuit pattern corresponding to a position of the conductive bump;
    adhering the solar cell to the transparent substrate in such a way that the conductive bump is in direct contact with the circuit pattern; and
    forming a protective resin layer on the one surface of the transparent substrate in such a way that the solar cell is covered.

2. The method of claim 1, wherein, in the adhering of the solar cell to the transparent substrate, the solar cell and the transparent substrate are separated from each other such that an air layer is formed between the solar cell and the transparent substrate.

3. The method of claim 1, further comprising, between the forming of the circuit pattern and the adhering of the solar cell to the transparent substrate, forming a junction layer on the one surface of the transparent substrate.

4. The method of claim 3, wherein the junction layer is formed on a position corresponding to positions of both sides of the bump.

5. The method of claim 4, wherein the bump is provided as a plurality of bumps, and the plurality of bumps are formed on the one surface of the solar cell and separated from one another.

6. The method of claim 5, wherein the junction layer is formed and extended on both sides of the bump so as to prevent the protective resin layer from entering through the plurality of bumps.

7. The method of claim 3, wherein the junction layer comprises thermosetting resin, and the adhering of the solar cell to the transparent substrate comprises:
    heating the junction layer; and
    pressing the solar cell toward the transparent substrate.

8. The method of claim 1, further comprising, before the forming of the circuit pattern, forming an antireflection layer on the one surface of the transparent substrate.

9. The method of claim 1, wherein the other surface of the transparent substrate is formed in a convexly curved shape such that light is converged toward the solar cell.

10. A method of manufacturing a solar cell module, the method comprising:
    forming a circuit pattern on one surface of a transparent substrate;
    forming a conductive bump on the circuit pattern;

adhering the transparent substrate to a solar cell in such a way that the conductive bump is in direct contact with a conductive pad formed on one surface of the solar cell; and forming a protective resin layer on the one surface of the transparent substrate in such a way that the solar cell is covered.

11. The method of claim 10, wherein, in the adhering of the transparent substrate to the solar cell, the solar cell and the transparent substrate are separated from each other such that an air layer is formed between the solar cell and the transparent substrate.

12. The method of claim 10, further comprising, before the adhering of the transparent substrate to the solar cell, forming a junction layer on the one surface of the solar cell.

13. The method of claim 12, wherein the junction layer comprises thermosetting resin, and the adhering of the transparent substrate to the solar cell comprises:

heating the junction layer; and pressing the solar cell toward the transparent substrate.

14. The method of claim 10, further comprising, before the forming of the circuit pattern, forming an antireflection layer on the one surface of the transparent substrate.

15. The method of claim 10, wherein the other surface of the transparent substrate is formed in a convexly curved shape such that light is converged toward the solar cell.

* * * * *